US006974037B2

(12) United States Patent
Haney

(10) Patent No.: US 6,974,037 B2
(45) Date of Patent: *Dec. 13, 2005

(54) RACK MOUNT ASSEMBLY

(75) Inventor: Gerome A Haney, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 36 days.

This patent is subject to a terminal disclaimer.

(21) Appl. No.: 10/629,005

(22) Filed: Jul. 29, 2003

(65) Prior Publication Data

US 2004/0020874 A1 Feb. 5, 2004

Related U.S. Application Data

(63) Continuation of application No. 09/428,306, filed on Oct. 27, 1999, now Pat. No. 6,681,942.

(51) Int. Cl.[7] .............................................. A47F 7/00
(52) U.S. Cl. .................. 211/26; 211/183; 211/190; 211/192
(58) Field of Search .................. 211/183, 175, 26, 211/151, 190–192, 204, 206, 126.15; 312/223.1, 312/330.1, 265.1, 265.4–265.6, 334.4; 361/683, 361/829, 724, 726–727; 248/200.1, 229.2, 248/221.11, 222.11, 224.8, 220.21, 226.21; 464/160

(56) References Cited

U.S. PATENT DOCUMENTS

| | | | |
|---|---|---|---|
| 2,777,377 A | 1/1957 | Johnson et al. | |
| 2,900,034 A | 8/1959 | Morrison | |
| 2,927,652 A | 3/1960 | Harrington et al. | |
| 3,042,221 A | 7/1962 | Rasmussen | |
| 3,133,768 A | 5/1964 | Klakovich | |
| 4,988,008 A | 1/1991 | Blum et al. | |
| 5,386,959 A | 2/1995 | Laughlin et al. | |
| 5,542,549 A | 8/1996 | Siemon et al. | |
| 5,571,256 A | 11/1996 | Good et al. | |
| 5,713,651 A | 2/1998 | Essig et al. | |
| 5,724,226 A | 3/1998 | Ruch et al. | |
| 5,791,498 A | 8/1998 | Mills | |
| 5,833,337 A | 11/1998 | Kofstad | |
| 5,941,498 A | 8/1999 | Boulay et al. | |
| 6,021,909 A | 2/2000 | Tang et al. | |
| 6,095,345 A | 8/2000 | Gibbons | |
| 6,230,903 B1 | 5/2001 | Abbott | |
| 6,422,399 B1 | 7/2002 | Castillo et al. | |
| 6,520,346 B1 | 2/2003 | Liu | |
| 6,681,942 B2 * | 1/2004 | Haney ........................ 211/183 |
| 2001/0037985 A1 | 11/2001 | Varghese et al. | |
| 2002/0108914 A1 | 8/2002 | Abbott | |
| 2002/0195408 A1 | 12/2002 | Hegrenes et al. | |
| 2003/0019824 A1 | 1/2003 | Gray | |

FOREIGN PATENT DOCUMENTS

GB              235205 A          2/2001

* cited by examiner

Primary Examiner—Jennifer E. Novosad

(57) ABSTRACT

A rack mount assembly for supporting a computer enclosure in a rack system having vertical apertured column flanges. The rack mount assembly includes an elongated mount adapter having mounting flanges disposed at each end thereof. Each mounting flange includes an alignment protrusion that is configured to fit in a corresponding aperture in one of the column flanges of the rack system. The elongated mount adapter comprises, for example, a slide mechanism or a rack rail.

28 Claims, 7 Drawing Sheets

US 6,974,037 B2

RACK MOUNT ASSEMBLY

CROSS-REFERENCE TO RELATED APPLICATIONS

This is a Continuation of U.S. patent application Ser. No. 09/428,306, filed on Oct. 27, 1999, now U.S. Pat. No. 6,681,942, which is incorporated herein by reference.

BACKGROUND OF THE INVENTION

The disclosed invention relates generally to electronic equipment rack systems, and more particularly to a rack mount system that is self-aligning when installed.

An electronic equipment rack system is an equipment supporting structure that includes four vertically oriented support columns, each having an apertured column flange. The support columns are fixedly located relative to each other so as to be at the corners of a rectangle, whereby two support columns are at a front of the rack system while two support columns are at a rear of the rack system. Thus, each of left and right sides of the rack system includes a front support column and a rear support column.

A left side rack mount assembly and a right side rack mount assembly are mounted horizontally opposite and parallel to each other on the left and right sides of the rack system to support a piece of electronic equipment to be installed in the rack system. Such left and right rack mount assemblies extend back to front, and include respective support panels or shelves for supporting an enclosure or chassis of the electronic equipment being supported in the rack system. The rack mount assemblies can comprise rack slide assemblies whereby the electronic equipment is slidably supported in the rack system so that the electronic equipment can be slid forwardly for access.

Typically, the rack mount assemblies are attached to the column flanges by rack nuts and bolts. For example, rack nuts are installed adjacent selected apertures in the column flanges, and bolts are passed through apertures in mounting flanges of the rack mount assemblies and threaded into the rack nuts.

A consideration with conventional installation of rack mount assemblies is difficulty of installation. If only one person is performing the installation, that person supports the rack mount assembly with one hand while installing bolts with the other hand. If two persons are performing the installation, one person supports the rack mount assembly while the other person installs bolts. Either way is awkward.

A further consideration with conventional rack mount assemblies is misalignment of the rack mount assemblies since the mounting bolts are smaller than the rack apertures. In other words, the mounting bolts do not align the apertures in the rack mount assembly flanges with the apertures in the column flanges. Vertical misalignment of the rack mount assemblies could cause interference between vertically adjacent computer equipment enclosures.

There is accordingly a need for a rack mount assembly that is easily and reliably aligned with rack apertures of a rack system, and is easily installed.

SUMMARY OF THE INVENTION

The disclosed invention is directed to a rack mount assembly that includes an elongated rack mount adapter having mounting flanges disposed at each end thereof. Each mounting flange includes an alignment protrusion that is configured to fit in a corresponding aperture in a column flange of a rack system. The elongated rack mount adapter comprises, for example, a slide mechanism or a rack rail.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
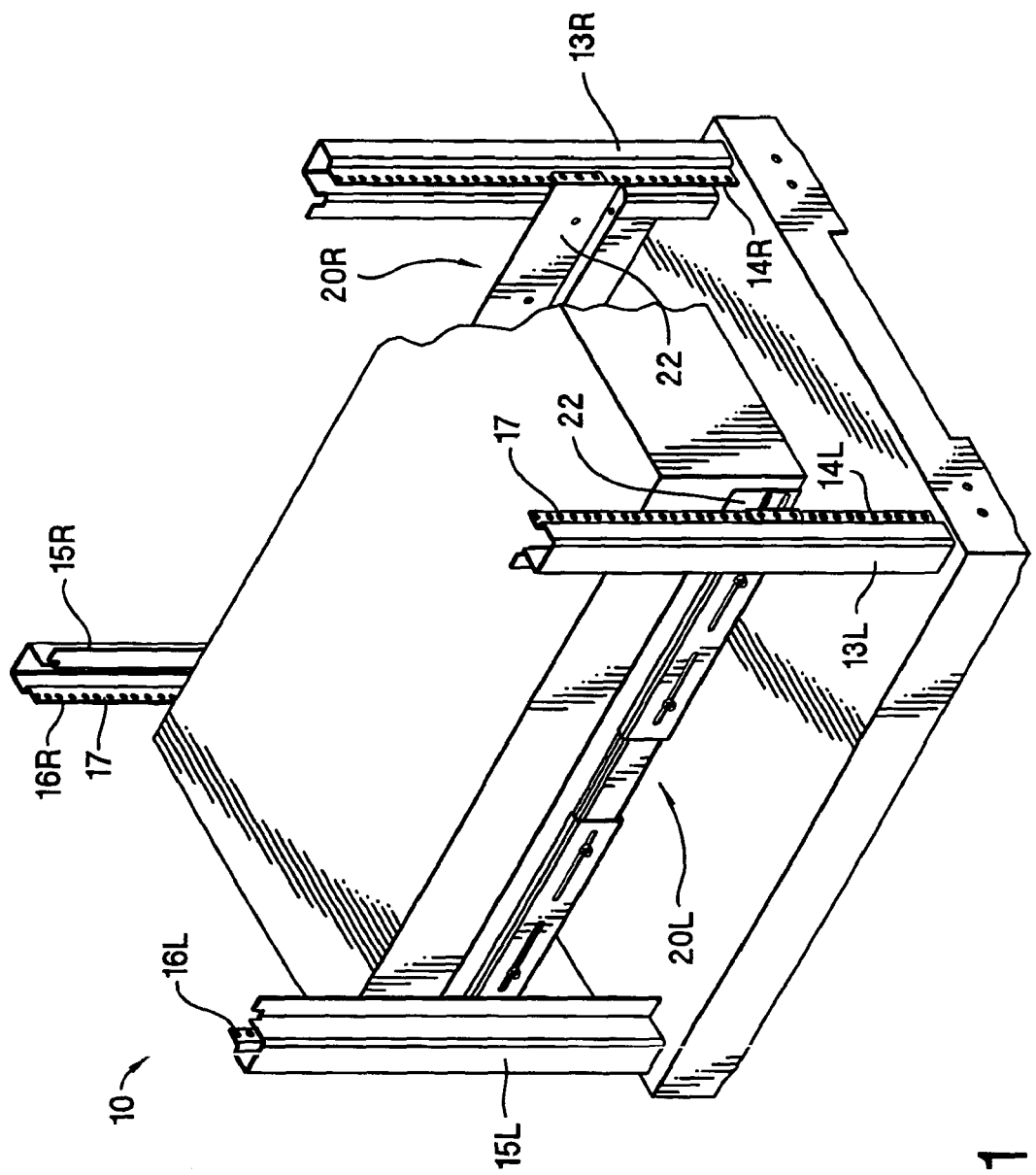
FIG. 1 is a schematic isometric view of a computer equipment rack system that employs rack mount assemblies in accordance with the invention.

In the following detailed description and in the several figures of the drawing, like elements are identified with like reference numerals.

Referring now to the FIG. 1, set forth therein is a schematic perspective view of rack system 10 that incorporates a left rack mount assembly 20L and a right rack mount assembly 20R in accordance with the invention. The rack system 10 more particularly includes a frame comprised of front columns 13L, 13R and rear columns 15L, 15R. The front columns 13L, 13R respectively include left and right front column flanges 14L, 14R in which are formed apertures 17, and the rear columns 15L, 15R also respectively include left and right rear column flanges 16L, 16R in which are formed apertures 17. Conventionally, the front column flanges 14L, 14R are coplanar, and the rear column flanges 16L, 16R are coplanar. Also conventionally, the column flanges when viewed from above are located at the vertexes of a rectangle.

In accordance with the invention, each of the rack mount assemblies 20L and 20R includes front and rear mounting flanges that respectively include protrusions that engage column flange apertures 17 in a self-aligning manner. Depending upon implementation, the protrusions can also support a rack mount assembly so that it can be secured to the rack system. By way of illustrative example, the rack mount assemblies 20L, 20R comprise slide assemblies and have respective L-channels 22 that are secured to inner channels of the slide assemblies (described further herein) for supporting computer equipment 11 that is placed on the L-channels after the rack mount assemblies are installed in the rack system.

The rack mount assemblies 20L and 20R are mirror images of each other, and thus it would be sufficient to describe the rack mount assembly 20L to illustrate the features of the invention.

Figure 2:
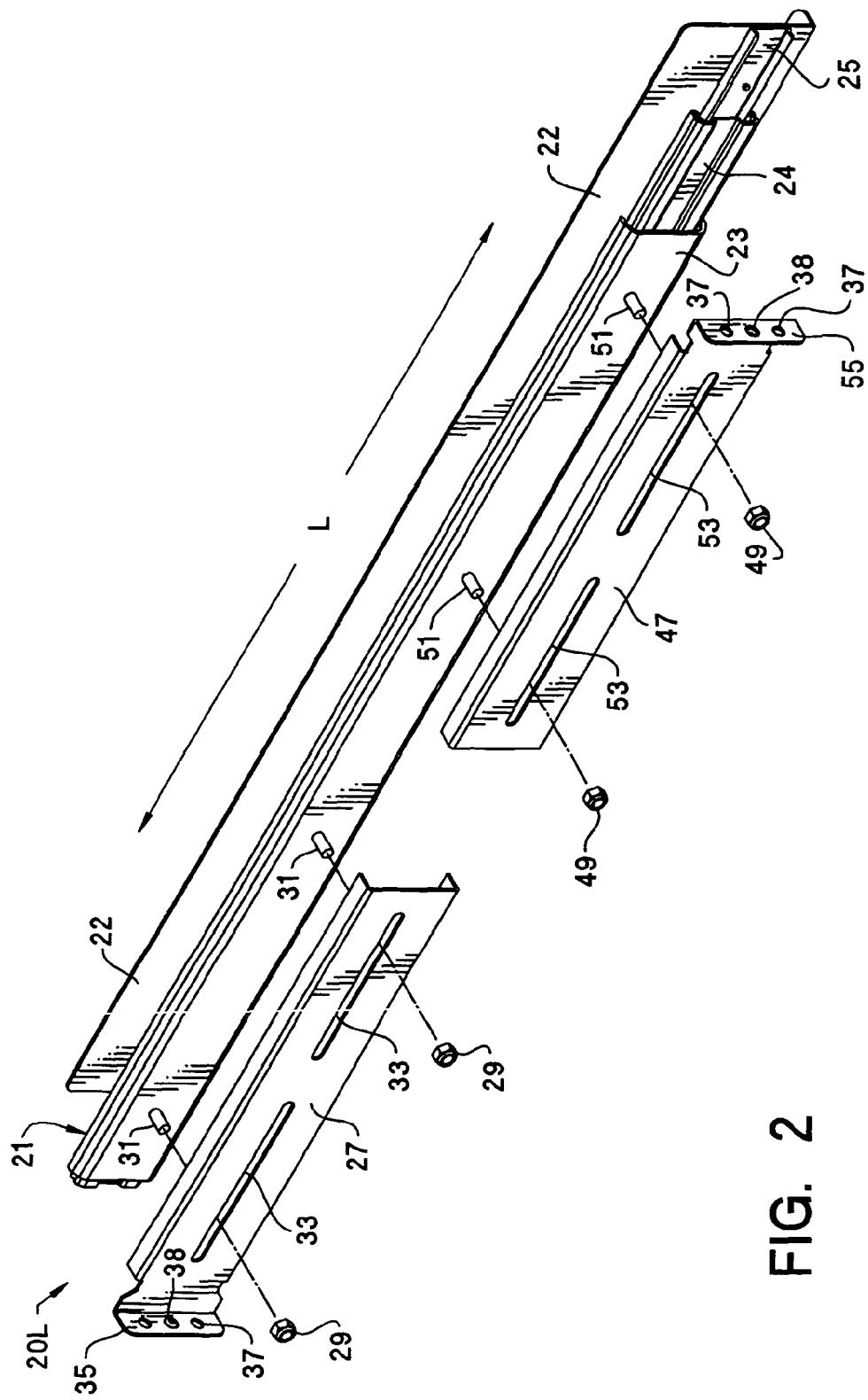
FIG. 2 is a schematic exploded isometric view of a rack mount assembly in accordance with the invention.
Figure 3A:
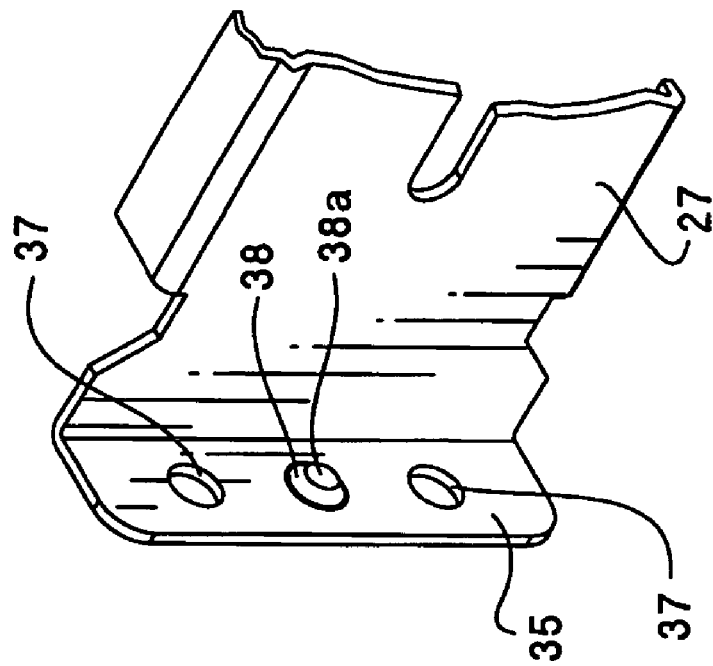
FIG. 3A is a schematic isometric view illustrating the mounting flange of a first mounting bracket of the rack mount assembly of FIG. 2.
Figure 3B:
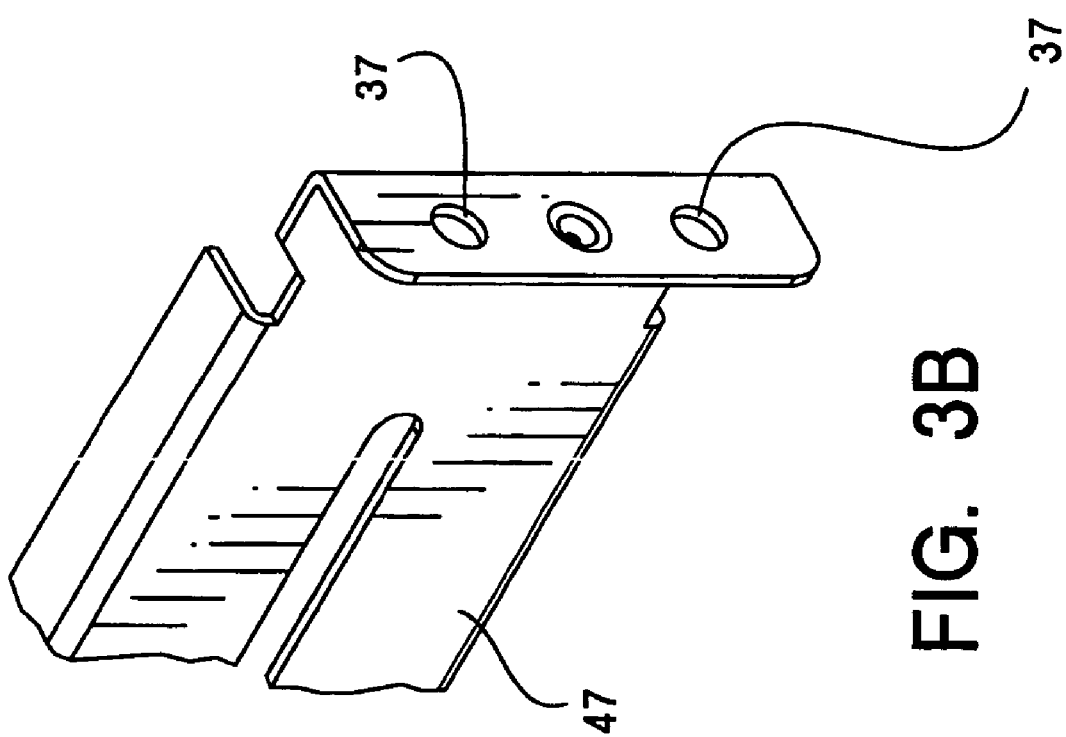
FIG. 3B is a schematic isometric view illustrating the mounting flange of a second mounting bracket of the rack mount assembly of FIG. 2.

Referring now to FIGS. 2, 3A, and 3B, the rack mount assembly 20L more particularly includes a conventional multiple-channel slide mechanism 21 comprised of an outer channel 23, a middle channel 24 that is slidably attached to the outer channel 23 for translational movement relative to the outer channel along a longitudinal axis L of the slide mechanism, and an inner channel 25 that is slidably attached to the middle channel 24 for translational movement relative to the middle channel 24 along the longitudinal axis L of the slide mechanism 21. A first mounting bracket 27 is attached to the outer channel 23 generally at a first end thereof by nuts 29 that are threadably secured onto studs 31 that are anchored to the outer channel and pass through elongated slots 33 in the first mounting bracket 27. The studs 31 and the elongated slots 33 are configured such that the first mounting bracket 27 can be adjusted along the longitudinal axis L relative to the outer channel 23. The position of the first mounting bracket relative to the outer channel 23 is fixed by tightening the nuts 29.

The first mounting bracket 27 further includes a mounting flange 35 at an end of the mounting bracket 27 that is in the vicinity of the first end of the outer channel 23. The mounting flange 35 is generally orthogonal to the longitudinal axis L of the slide mechanism 21, and includes mounting apertures 37 formed therein. In accordance with the invention, an alignment and support protrusion 38 is formed in the mounting flange 35 between the mounting apertures 37, and by way of illustrative example extends inwardly. The spacing of the mounting apertures 37 and the alignment and support protrusion 38 corresponds to the spacing of the rack apertures 17, for example such when the protrusion 38 is engaged in a selected rack aperture 17 the mounting apertures 37 are aligned with apertures 17 adjacent the aperture 17 in which the protrusion is engaged.

A second mounting bracket 47 is attached to the outer channel 23 generally at a second end thereof by nuts 49 that are threadably secured onto studs 51 that are anchored to the outer channel and pass through elongated slots 53 in the second mounting bracket 47. The studs 51 and the elongated slots 53 are configured such that the second mounting bracket 47 can be adjusted along the longitudinal axis L relative to the outer channel 23. The position of the second mounting bracket 47 relative to the outer channel 23 is fixed by tightening the nuts 49.

The second mounting bracket 47 further includes a mounting flange 55 at an end of the second mounting bracket 47 that is in the vicinity of the second end of the outer channel 23. The mounting flange 55 is generally orthogonal to the longitudinal axis L of the slide mechanism 21, and includes mounting apertures 37 formed therein. In accordance with the invention, an alignment and support protrusion 38 is formed in the mounting flange 55 between the mounting apertures 37, and by way of illustrative example extends inwardly such that the protrusions 38 on the mounting flanges 35, 55 extend toward each other. The spacing of the mvountiang apertures 37 and the alignment and support protrusion 38 corresponds to the spacing of the rack apertures 17, for example such when the protrusion 38 is engaged in a selected rack aperture 17 the mounting apertures 37 are aligned with apertures 17 adjacent the aperture 17 in which the protrusion is engaged.

By way of illustrative example, each of the alignment and support protrusions 38 comprises a truncated cone wherein the wider end of the cone is adjacent the flange 35 or 55. A generally circular surface 38a is at the narrower end of the truncated cone, and the transition between the generally circular surface 38a and the truncated is cone radiused in a convex manner rather than being a corner. The transition between the flange 35 or 55 and the truncated cone is radiused in a concave manner. Preferably, the widest portion of the alignment and support protrusion 38 that is adjacent the flange 35 or 55 is configured to snugly fit a corresponding rack aperture 17. By way of illustrative example, each of the protrusions 38 is made with a die and a punch.

In use, the first mounting bracket 27 and the second mounting bracket 47 are adjusted so that the flanges 35, 55 will snugly slide over the outside surfaces of the left front and rear column flanges 14L, 16L (i.e. the forward facing surface of the left front column flange 14L and the rearward facing surface of the right front column flange 16L). In other words, the length of the rack mount assembly is adjusted or preset so that the distance between the inside surfaces of the flanges 35, 55 (i.e., the surfaces from which the alignment and support protrusions 38 extend) is just slightly greater than the distance between the outside surfaces of the left front and rear column flanges 14L, 16L, so that the protrusions 38 provide some interference when the mounting flanges 35, 55 are slid over the front and rear column flanges 14L, 16L. It is desired that the protrusions 38 seat snugly in selected apertures 17 so that the rack mount assembly 20L is supported by the engagement of the protrusions 38 with selected apertures 17 without the need to otherwise support the rack mount assembly 20L.

Figure 4:
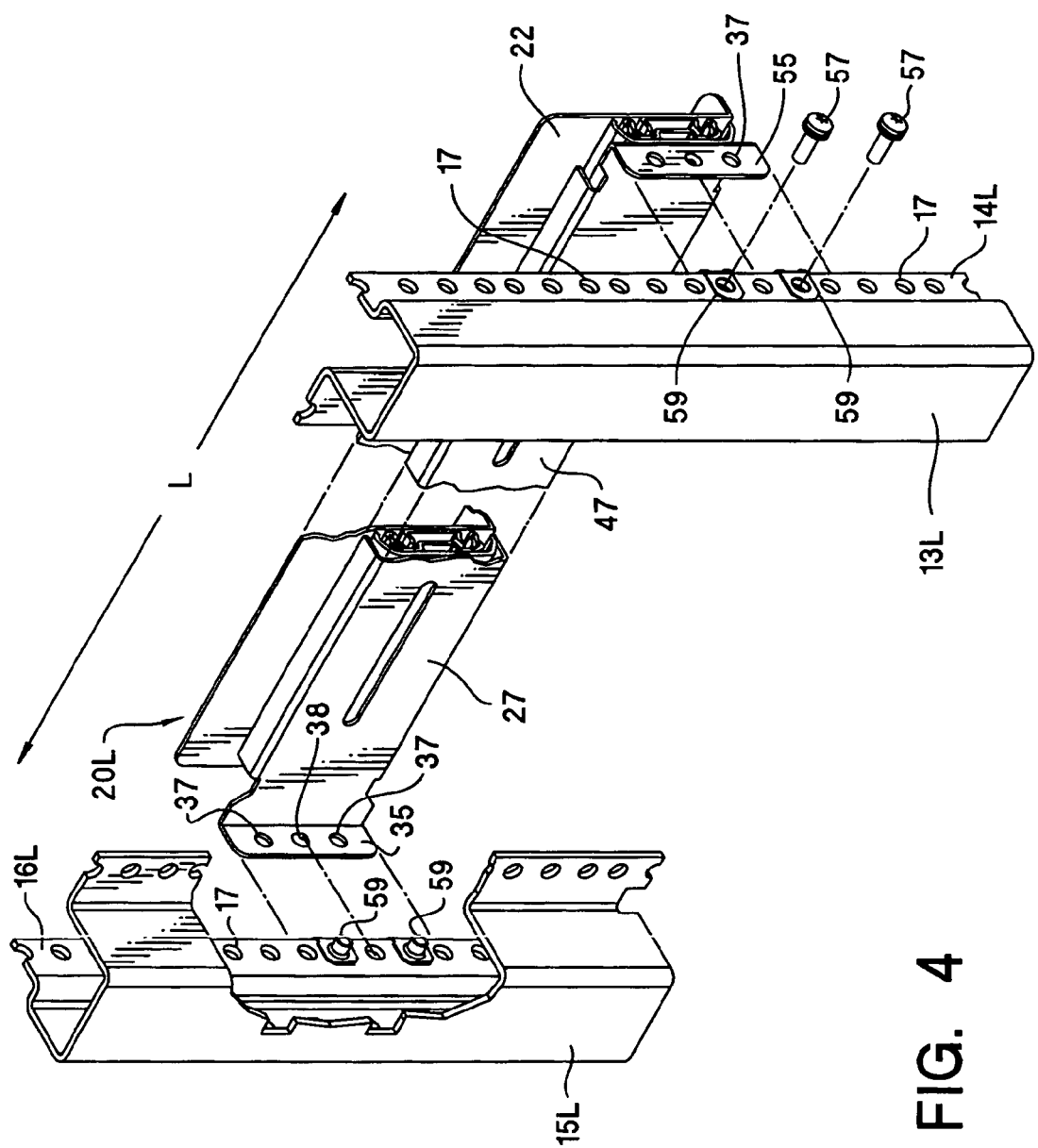
FIG. 4 is a schematic isometric view illustrating installation of the rack mount assembly of FIG. 2 in the rack system of FIG. 1.

The rack mount assembly 20L is then engaged onto the left front and rear column flanges 14L, 16L by sliding the mounting flanges 35, 55 over the column flanges so as to engage the alignment and support protrusions 38 in selected mounting apertures 17, as generally indicated in FIG. 4. In view of the fit between the flanges 35, 55 and the left front column flanges 14L 16L, the column flanges may deform very slightly to accommodate the sliding of the protrusions 38 over the column flange surfaces before the protrusions seat in selected mounting apertures 17.

After the protrusions 38 are seated in selected apertures 17, the rack mount assembly 20L is supported in place by the engagement of the protrusions in selected apertures, and screws 57 are passed through the mounting apertures 37 and threaded into rack nuts 59 to secure the flanges 35, 55 to the column flanges 14L, 16L.

Figure 5:
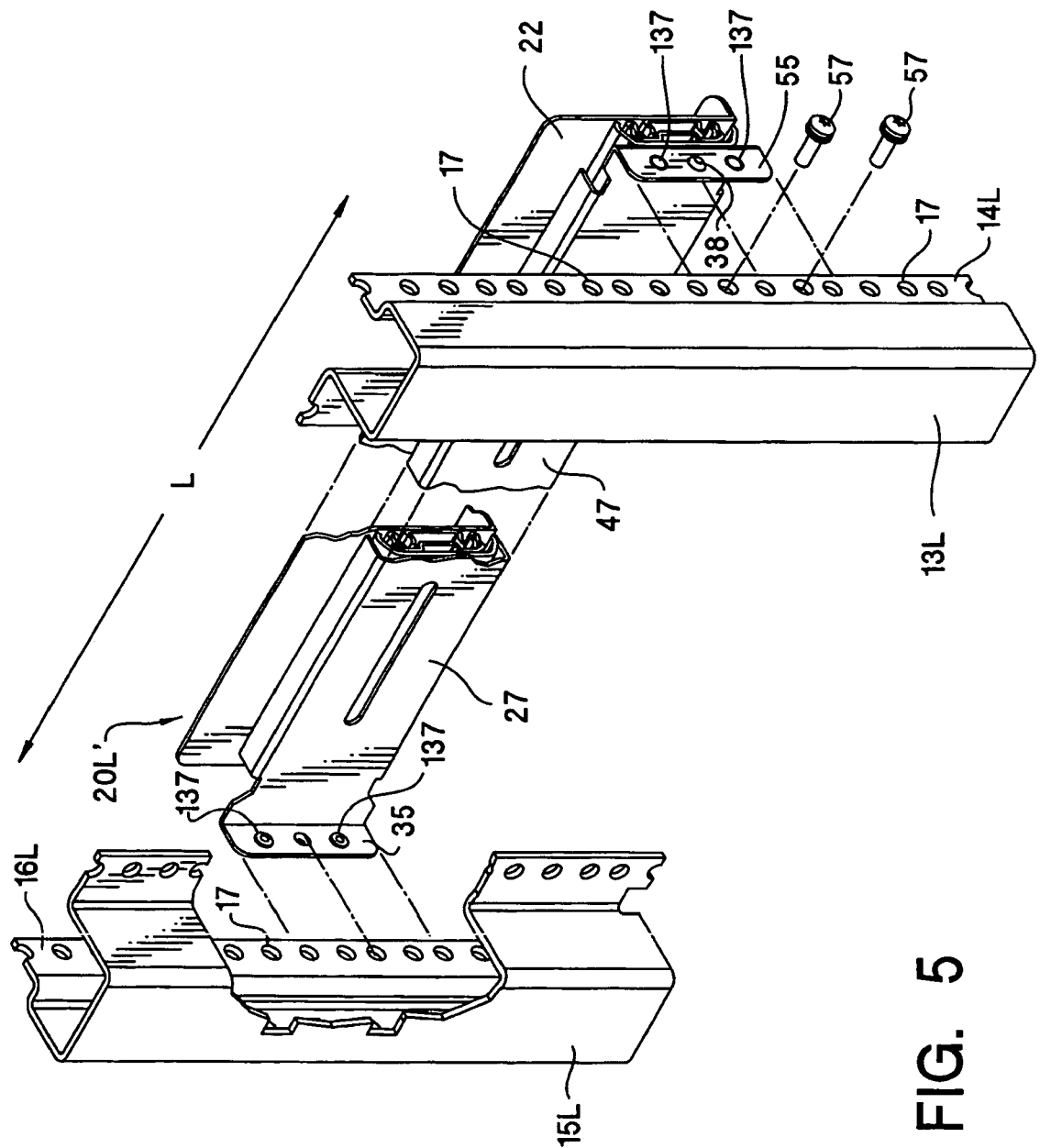
FIG. 5 is a schematic isometric view of another rack mount assembly in accordance with the invention.

Referring now to FIG. 5 schematically illustrated therein is another embodiment of a rack mount assembly 20L' in accordance with the invention. The rack mount assembly 20L' is similar to the rack mount assembly 20L of FIG. 2, except for alignment and support protrusions 38 that extend outwardly away from each other and threaded inserts 137 secured in the flanges 35, 55.

In use, the first mounting bracket 27 and the second mounting bracket 47 of the rack mount assembly 20L' of FIG. 5 are adjusted so that the flanges 35, 55 will snugly slide between the inside facing surfaces of the left front and rear column flanges 14L, 16L (i.e., the surfaces that face each other, namely, the rearward facing surface of the left front column flange 14L and the forward facing surface of the left rear column flange 16L). In other words, the length of the rack mount assembly 20L' is preset so that the distance between the outside surfaces of the flanges 35, 55 (i.e., the surfaces from which the alignment and support protrusions 38 extend) is just slightly less than the distance between the inside facing surfaces of the left front and rear column flanges 14L, 16L, so that the protrusions 38 provide some interference when the mounting flanges 35, 55 are slid between the column flanges 14L, 16L. It is desired that the protrusions 38 seat snugly in selected apertures 17 so that the rack mount assembly 20L' is supported by the engagement of the protrusions 38 with selected apertures 17 without the need to otherwise support the rack mount assembly 20L'.

The rack mount assembly 20L' is then engaged onto the left front and rear column flanges 14L, 16L by sliding the mounting flanges 35, 55 between such column flanges so as to engage the alignment and support protrusions 38 in selected apertures 17. In view of the fit between the mounting flanges 35, 55 and the column flanges 14L, 16L, the column flanges may deform very slightly to accommodate the sliding of the protrusions 38 over the column flange surfaces before the protrusions seat in selected apertures 17.

After the alignment and support protrusions 38 are seated in selected apertures 17, the rack mount assembly 20L is supported in place by the engagement of the protrusions 38 in selected apertures 17, and screws 57 are readily passed through apertures 17 and threaded into the inserts 137 to secure the flanges 35, 55 to the column flanges 14L, 16L.

Figure 6:
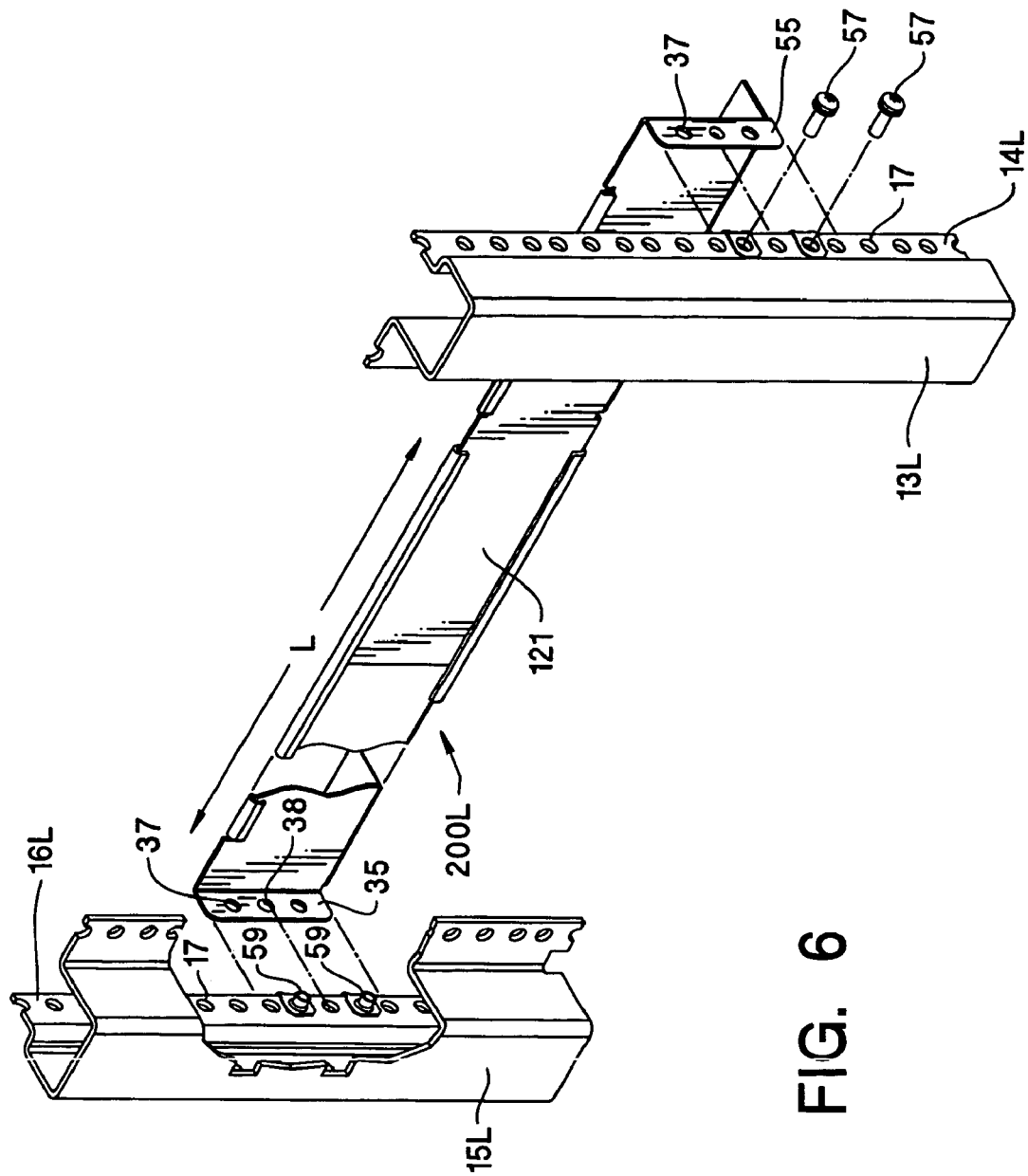
FIG. 6 is a schematic isometric view of a further rack mount assembly in accordance with the invention.

Referring now to FIG. 6, schematically illustrated therein is another embodiment of a rack mount assembly 200L in accordance with the invention. The rack mount assembly 200 includes a rack rail 121, a first mounting flange 35 connected to a first end of the rack rail 121, and a second mounting flange 55 connected to a second end of the rack rail 121. The mounting flanges 35, 55 are orthogonal to the longitudinal axis L of the rack rail 121, and mounting apertures 37 are formed therein. In accordance with the invention, an inwardly facing alignment protrusion 38 is formed in each of the mounting flanges 35, 55, substantially as in the flanges 35, 55 of the rack mount assembly 20L of FIG. 2A. The rack rail 121 can be of fixed length or presetable length (i.e., adjusted and then locked at a particular length). Alternatively, the rack rail 121 can be non-lockingly adjustable as to length.

In use, a fixed length or presettable length rack mount assembly 200L of FIG. 6 is installed similarly to the rack mount assembly 20L of FIG. 2. A non-lockingly adjustable length rack mount assembly 200L of FIG. 6 would need to be supported while bolts are installed, and the alignment protrusions would advantageously provide alignment.

Figure 7:
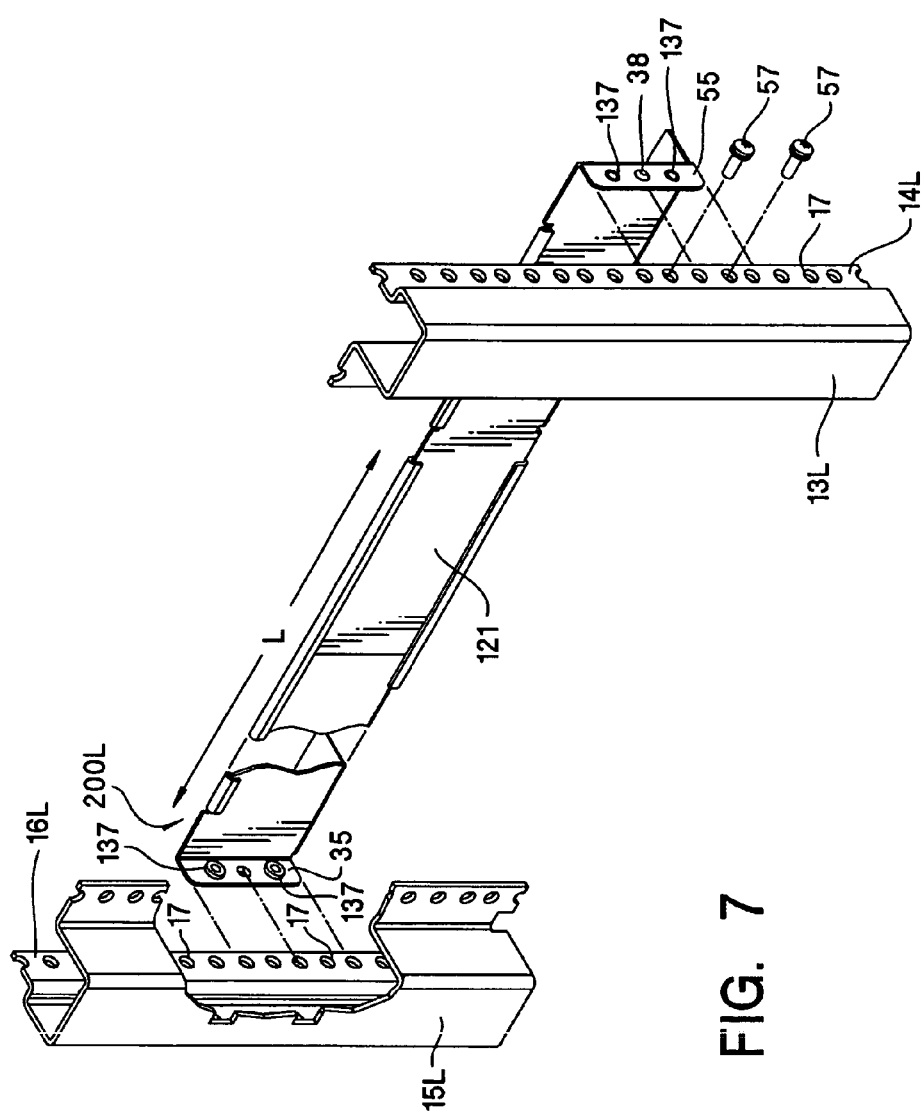
FIG. 7 is a schematic isometric view of still another rack mount assembly in accordance with the invention.

Referring now to FIG. 7, schematically illustrated therein is another embodiment of a rack mount assembly 200L' in accordance with the invention. The rack mount assembly 200L' is similar to the rack mount assembly 200L of FIG. 6, except for alignment protrusions 38 that extend outwardly away from each other and threaded inserts 137 secured in the flanges 35, 55, substantially as in the flanges 35, 55 of the rack mount assembly 20L' of FIG. 5.

In use, a fixed length or presettable length rack mount assembly 200L' of FIG. 7 is installed similarly to the rack mount assembly 20L' of FIG. 5. A non-lockingly adjustable length rack mount assembly 200L' of FIG. 7 would need to be supported while bolts are installed, and the alignment protrusions would advantageously provide alignment.

The disclosed rack mount assembly thus generally includes an elongated rack mount adapter (e.g., a slide mechanism or a rack rail), mounting flanges disposed at each end of the rack mount adapter, and an alignment protrusion formed in each of the mounting flanges and configured to fit in a corresponding aperture in a rack system. In implementations where the elongated rack mount adapter is of fixed-length or of presettable length, the alignment protrusion further functions to support the rack mount assembly during installation.

The foregoing has thus been a disclosure of a rack mount assembly that is readily aligned with rack apertures in a rack system. The protrusions function to align the apertures in the mounting brackets of the rack mount assembly with apertures in the vertical support rails, and with a fixed length or presettable length rack mount assembly can support the rack mount assembly while fasteners are installed to secure the mounting brackets to the support rails.

Although the foregoing has been a description and illustration of specific embodiments of the invention, various modifications and changes thereto can be made by persons skilled in the art without departing from the scope and spirit of the invention as defined by the following claims.

What is claimed is:

1. A rack mount assembly for a rack system including opposing column flanges having flange apertures formed therein, the rack mount assembly comprising:
   a rack mount having a first end and a second end;
   a first mounting flange adjacent the first end of the rack mount, the first mounting flange having a first alignment protrusion formed thereon; and
   a second mounting flange adjacent the second end of the rack mount, the second mounting flange having a second alignment protrusion formed thereon,
   wherein the first and second mounting flanges contact the opposing column flanges when the rack mount is in a first position between the opposing column flanges,
   wherein the first and second alignment protrusions contact and slide relative to the opposing column flanges when the rack mount is in a second position between the opposing column flanges, and
   wherein the first and second alignment protrusions engage the flange apertures when the rack mount is in a third position between the opposing column flanges,
   wherein a length of the rack mount is defined from the first mounting flange to the second mounting flange, and wherein the length of the rack mount is maintained when the rack mount is in the first position, the second position, and the third position.

2. The rack mount assembly of claim 1, wherein the first and second alignment protrusions are adapted to contact and slide relative to the opposing column flanges along a surface of a respective one of the opposing column flanges.

3. The rack mount assembly of claim 1, wherein the first and second alignment protrusions are adapted to contact and slide relative to the opposing column flanges in a direction substantially perpendicular to a longitudinal axis of the opposing column flanges.

4. The rack mount assembly of claim 1, wherein the first and second alignment protrusions are adapted to support the rack mount between the opposing column flanges.

5. The rack mount assembly of claim 1, the opposing column flanges having additional flange apertures formed therein, wherein the first and second mounting flanges each have at least one mounting aperture formed therein, and wherein the at least one mounting aperture of each of the first and second mounting flanges is adapted to be aligned with one of the additional flange apertures when the first and second alignment protrusions engage the flange apertures.

6. The rack mount assembly of claim 1, wherein the length of the rack mount is adjustable before the rack mount is in the first position.

7. The rack mount assembly of claim 1, wherein the first and second mounting flanges are substantially orthogonal to a longitudinal axis of the rack mount, and wherein the alignment protrusions of the first and second mounting flanges extend toward each other.

8. The rack mount assembly of claim 1, wherein the first and second mounting flanges are substantially orthogonal to a longitudinal axis of the rack mount, and wherein the alignment protrusions of the first and second mounting flanges extend away from each other.

9. The rack mount assembly of claim 1, wherein the rack mount is adapted to support an enclosure.

10. The rack mount assembly of claim 1, wherein the rack mount includes a first mounting bracket including the first mounting flange and a second mounting bracket including the second mounting flange.

11. The rack mount assembly of claim 1, wherein the rack mount includes an outer channel and an inner channel slidably supported by the outer channel, wherein the inner channel is adapted to support rack mount equipment.

12. The rack mount assembly of claim 1, wherein the rack mount includes a rack rail, wherein the rack rail is adapted to support rack mount equipment.

13. The rack mount assembly of claim 1, wherein the first and second alignment protrusions include truncated cones.

14. A rack system, comprising:
  opposing column flanges each having flange apertures formed therein; and
  a rack mount including a first mounting flange at a first end thereof and a second mounting flange at a second end thereof, the first mounting flange having a first alignment protrusion formed thereon and the second mounting flange having a second alignment protrusion formed thereon,
  wherein the first and second mounting flanges contact the opposing column flanges when the rack mount is in a first position between the opposing column flanges,
  wherein the first and second alignment protrusions engage the flange apertures when the rack mount is in a second position between the opposing column flanges,
  wherein the first and second alignment protrusions contact and slide relative to the opposing column flanges when the rack mount is moved from the first position to the second position, and
  wherein a length of the rack mount is defined from the first mounting flange to the second mounting flange, and wherein the length of the rack mount is maintained when the rack mount is moved from the first position to the second position.

15. The rack system of claim 14, wherein the first and second alignment protrusions contact and slide relative to the opposing column flanges along a surface of a respective one of the opposing column flanges.

16. The rack system of claim 14, wherein the first and second alignment protrusions contact and slide relative to the opposing column flanges in a direction substantially perpendicular to a longitudinal axis of the opposing column flanges.

17. The rack system of claim 14, wherein the first and second alignment protrusions support the rack mount between the opposing column flanges.

18. The rack system of claim 14, wherein the opposing column flanges each have additional flange apertures formed therein, wherein the first and second mounting flanges each have at least one mounting aperture formed therein, and wherein the at least one mounting aperture of each of the first and second mounting flanges is aligned with one of the additional flange apertures when the first and second alignment protrusions engage the flange apertures.

19. The rack system of claim 14, wherein the length of the rack mount is adjustable before the rack mount is in the first position.

20. The rack system of claim 14, wherein the first and second mounting flanges are substantially orthogonal to a longitudinal axis of the rack mount, and wherein the alignment protrusions of the first and second mounting flanges extend toward each other.

21. The rack system of claim 14, wherein the first and second mounting flanges are substantially orthogonal to a longitudinal axis of the rack mount, and wherein the alignment protrusions of the first and second mounting flanges extend away from each other.

22. The rack system of claim 14, wherein the rack mount is adapted to support an enclosure.

23. The rack system of claim 14, wherein the rack mount includes a first mounting bracket including the first mounting flange and a second mounting bracket including the second mounting flange.

24. The rack system of claim 14, wherein the rack mount includes an outer channel and an inner channel slidably supported by the outer channel, wherein the inner channel is adapted to support rack mount equipment.

25. The rack system of claim 14, wherein the rack mount includes a rack rail, wherein the rack rail is adapted to support rack mount equipment.

26. The rack system of claim 14, wherein the first and second alignment protrusions include truncated cones.

27. A method of mounting a rack mount assembly including first and second mounting flanges in a rack system including opposing column flanges, the method comprising:
  positioning the rack mount assembly to span the opposing column flanges of the rack system, including adjusting a length of the rack mount assembly from the first mounting flange to the second mounting flange and contacting the opposing column flanges with the first and second mounting flanges of the rack mount assembly;
  after positioning the rack mount assembly to span the opposing column flanges, including after adjusting the length of the rack mount assembly, maintaining the length of the rack mount assembly and sliding the rack mount assembly relative to the opposing column flanges, including contacting the opposing column flanges with alignment protrusions formed on the first and second mounting flanges of the rack mount assembly and sliding the alignment protrusions along a surface of the opposing column flanges; and
  after sliding the rack mount assembly relative to the opposing column flanges, maintaining the length of the rack mount assembly and engaging flange apertures of the opposing column flanges with the alignment protrusions.

28. The method of claim 27, wherein sliding the rack mount assembly relative to the opposing column flanges includes sliding the alignment protrusions in a direction substantially perpendicular to a longitudinal axis of the opposing column flanges.

* * * * *